United States Patent [19]
Simmons et al.

[11] Patent Number: 4,801,558
[45] Date of Patent: Jan. 31, 1989

[54] ELECTROSTATIC DISCHARGE PROTECTION USING THIN NICKEL FUSE

[75] Inventors: Arturo Simmons; Shawn T. Walsh, both of Garland; Charles G. Roberts, McKinney, all of Tex.

[73] Assignee: Texas Instruments Incorporated, Dallas, Tex.

[21] Appl. No.: 79,051

[22] Filed: Jul. 29, 1987

Related U.S. Application Data

[60] Division of Ser. No. 907,130, Sep. 12, 1986, Pat. No. 4,714,949, and a continuation of Ser. No. 656,111, Sep. 28, 1984, abandoned.

[51] Int. Cl.⁴ .............................. C25F 3/00; C25F 3/14
[52] U.S. Cl. ........................................ 437/170; 357/30; 148/DIG. 55; 437/5; 437/22; 437/922
[58] Field of Search ............... 437/22, 5, 170, 922; 357/30

[56] References Cited

U.S. PATENT DOCUMENTS

| | | | |
|---|---|---|---|
| 4,045,310 | 8/1977 | Jones et al. | 357/51 |
| 4,072,976 | 2/1978 | Harrari | 357/51 |
| 4,080,616 | 3/1978 | Horie | 357/51 |
| 4,223,277 | 9/1980 | Taylor et al. | 437/170 |
| 4,231,149 | 11/1980 | Chapman et al. | 437/22 |
| 4,630,355 | 12/1986 | Johnson | 437/170 |
| 4,647,340 | 3/1987 | Szluk et al. | 437/59 |

OTHER PUBLICATIONS

Article, "Programmable Fuse-Element" Res. Disclosure, Apr. 1986, No. 264 #26440.

Primary Examiner—Upendra Roy
Attorney, Agent, or Firm—Ferdinand M. Romano; James T. Comfort; Melvin Sharp

[57] ABSTRACT

The disclosure relates to a system for protecting HgCdTe and the like MIS arrays from breakdown during fabrication due to electrostatic charge buildup on the array capacitors. This is accomplished by building into the structure a short circuit across the capacitor plates with a fuse region therein that will evaporate when a voltage is placed thereacross which is sufficient to cause evaporation and low enough not to damage the capacitors.

18 Claims, 1 Drawing Sheet

ELECTROSTATIC DISCHARGE PROTECTION USING THIN NICKEL FUSE

This is a division of application Ser. No. 907,130, filed Sept. 12, 1986, now U.S. Pat. No. 4,714,949, which is a continuation of Ser. No. 656,111 filed Sept. 28, 1984, now abandoned.

BACKGROUND OF THE INVENTION

1. Field of the Invention

This invention relates to mercury - cadmium telluride (HgCdTe) MIS arrays, and, more specifically, to a method of protecting against electrostatic discharges across the dielectric during array fabrication which cause damage and/or imprefections in the array elements.

2. Description of the Prior Art

MIS array elements are susceptible to charge buildup and ultimate catastrophic breakdown in the insulator due to the voltage that can be built up because the elements are capacitors and include insulators which are not perfect and have a breakdown voltage. Charges on these capacitors can be picked up anywhere during processing or handling of the elements themselves. Prior art MIS elements of the type involved herein normally include a HgCdTe substrate which is one plate of the capacitor and which has an oxide passivating layer thereon, further insulating layer of zinc sulfide over the oxide layer and a gate electrode over the insulating layer. This is the basic unit of all infrared focal plane imagers. The gate forms the other plate of the capacitor and any charge built up thereon which is too large will break down the dielectric and cause a short circuit. The problems encountered by this action are not only catastrophic failure noted above but also the problem that, though a short circuit does not exist, the insulating layer may have been damaged to the extent that the flat band voltage varies due to a voltage across the insulator during manufacture which is not enough to cause breakdown, but is enough to move the fixed charge in the oxide layer and in the active region therefrom. Furthermore, due to the problem of breakdown as described hereinabove, the prior art MIS arrays are normally probed to locate faulty elements. This also presents a problem in that the function of probing itself causes breakdown of elements to some extent, thereby further reducing the ultimate yield. The above noted problem exists only in HgCdTe and similar type compounds wherein diodes cannot be formed as in the case of silicon and the like. Accordingly, the solution to the problem described thereinabove can not be provided by the addition of a diode between the bonding pad and the HgCdTe substrate as is done in silicon and other materials wherein diodes can be formed in the substrate itself.

SUMMARY OF THE INVENTION

In accordance with the present invention, the above problems of the prior art are materially reduced and there is provided a method by which MIS arrays can be formed with substantially higher yields due to a reduction in the number of elements having short circuits or imperfections therein due to the buildup of voltage on the capacitor plates during fabrication. Briefly, this is accomplished by providing a substrate of n-type mercury cadmium telluride as in the prior art and forming a passivating oxide layer thereon and a zinc sulfide layer over the passivating layer as in the prior art. With reference now to only one of the many identically produced array elements, the procedure is now altered by forming a via through the zinc sulfide insulator and passivating oxide layers to the substrate prior to forming a nickel gate structure of novel design. The nickel gate structure includes the gate region as well as a reduced cross sectional region which acts as a fuse and is about one tenth the width of the gate or less and extends through the via and contacts the substrate. An aluminum bus line is formed over the via and extends therein and a further aluminum portion is formed over the gate portion to act as a via stop. A second zinc sulfide layer is then formed over the entire surface of the array and a via is then formed extending from the top of the second zinc sulfide layer to the via stop. An indium bond pad is then formed on the surface of the second zinc sulfide layer and extends through the via therein to the via stop to provide external connection to the gate.

It can be seen that, from the point at which the gate structure is formed, there is a continual short circuit from the gate structure to the substrate during the remainder of the processing steps. Accordingly, any charge buildup on the gate structure will be dissipated via the short circuit to the substrate. After completion of the array and preferably just prior to installation, a voltage which is sufficient to blow the fuse but not high enough to cause damage to the array is applied across the substrate and the bond pad to remove the short circuit. At this point, protection of the array from an overvoltage will be provided by the circuitry in which the array is disposed.

DESCRIPTION OF THE PREFERRED EMBODIMENT

Figure 1:
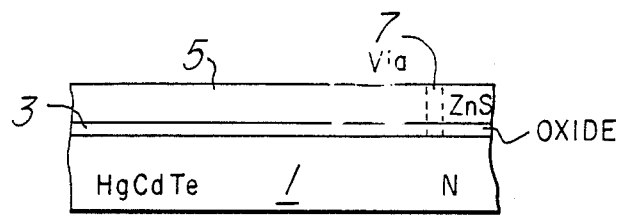
FIG. 1 is a schematic drawing of a partially formed array produced in accordance with the present invention.
Figure 2A:
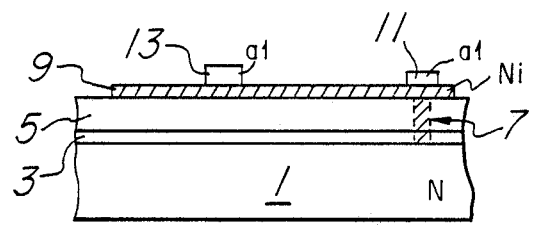
FIG. 2A is a view as in FIG. 1 with the process farther advanced.
Figure 2B:
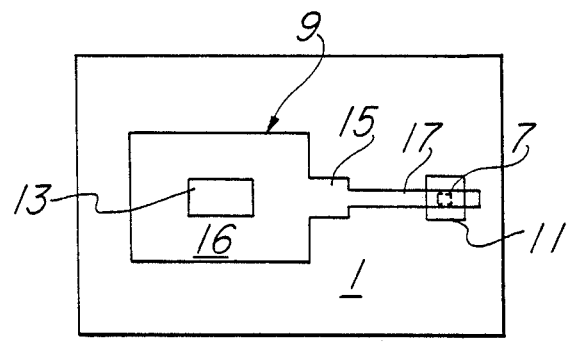
FIG. 2B is a top view of the embodiment of FIG. 2A.

Referring now to FIG. 1, there is shown a mercury cadmium telluride substrate 1 of n-type having an oxide passivating layer 3 thereon which is formed by placing the substrate 1 in electrolyte solution in known manner. A zinc sulfide insulating layer 5 is formed over the passivating layer 3 by vacuum deposition in standard manner and a via 7 is then etched through the insulating layer 5 and passivating layer 3 to the substarte 1 by appropriate masking and etching using an appropriate etchant containing 1/16 of 1% bromine in methanol by volume. Referring now to FIG. 2A and 2B, the procedure continues by providing a patterned photoresist and then evaporating nickel fuse and gate 9 in standard manner of about 50 to 100 angstroms over the zinc sulfide and into the via 7 in those regions where the photoresist is not deposited. An aluminum bus line 11 which extends into the via 7 along with the nickel 9 therein is then deposited in standard manner and makes electrical contact with the nickel and a further aluminum via stop 13 as deposited simultaneously therewith which makes electrical contact with the nickel layer 9 and acts as a via stop which will be discussed in more detail hereinbelow. With specific reference to FIG. 2B, it can be seen that the nickel layer 9 includes areas of reduced thickness 15 and 17, the region 17 being designed to operate as a fuse at a voltage below the voltage at which the array would become damaged and having a width of about 0.2 mils. As can be seen from FIG. 2B the nickel portion 17 extends into the via 7 as discussed above. The region 16 will be the gate of the final array element.

Figure 3:
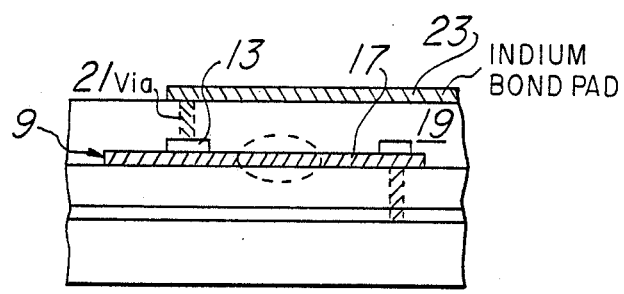
FIG. 3 is a view as in FIG. 2A with the process still farther advanced.
Figure 4:
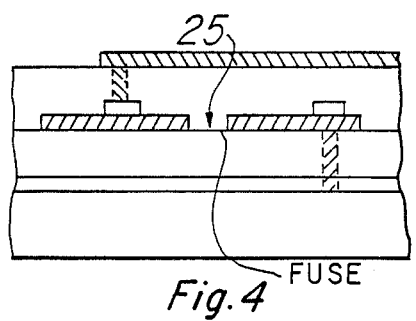
FIG. 4 is a view as in FIG. 3 showing the completed array after fabrication and fuse removal.

Referring now to FIG. 3, it can be seen that a second zinc sulfide layer 19 is formed over the top surface of the array in the same manner as the layer 5 was formed and a via 21 is formed therein by masking and etching in the same manner discussed above for layer 5 and via 7. Via 21 extends from the top surface of the zinc sulfide layer 19 to the aluminum via stop 13. The aluminum in the via stop 13 acts as a stop for the bromine in methanol etchant utilized as discussed hereinabove. An indium bond pad 23 is then vacuum deposited in standard patterned manner on the top surface of the zinc sulfide layer 19, the indium extending into via 21 to make contact with the aluminum via stop 13 and thereby make contact with the nickel gate region 16. It can be seen that during the entire processing of the array through the steps described hereinabove, the gate region 16 is constantly short circuited to the substrate 1 from the time of its formation, thereby preventing the formation of short circuits or other deleterious effects to arry elements during the processing. At this point, a voltage which is sufficient to open the fuse 17 but insufficient to cause breakdown of the dielectric layer 5 is applied between the bond pad 23 and the substrate 1 to open the fuse 17 as shown in FIG. 4 at the opening 25 to isolate the gate region 16 from the remainder of the fuse circuit.

It can be seen that there has been provided a relatively simple and inexpensive method for forming MIS arrays in a mercury cadmium telluride substate which minimizes losses and yield due to short circuit and other deleterious effects causing faulty operation of the array elements.

It should be understood that while the materials set forth above are preferred, any semiconductor substate in which MIS or MOS type devices are desired are acceptable substrates. Also, insulators other than zinc sulfide may be used and gate materials other than nickel can be used, nickel being preferred when light transmissive contacts are desirable.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of making a semiconductor device, comprising the steps of:
   (a) providing a semiconductor substrate;
   (b) forming an insulating layer on said substrate;
   (c) forming a via through said insulating layer to said substrate; and
   (d) forming a conductive layer having a gate region and a reduced area fuse region on said insulating layer, said reduced area region extending to said substrate through said via.

2. A method as set forth in claim 1 further including:
   (e) forming an electrically conductive etch stop on said conductive layer;
   (f) forming a second insulating layer over said conductive layer;
   (g) etching a via in said second insulating layer to said etch stop; and
   (h) forming a bonding pad on said second insulating layer extending through said via to said etch stop.

3. A method as set forth in claim 1 further including the step of applying a voltage across said conductive layer and said substrate to burn away said fuse region.

4. A method as set forth in claim 2 further including the step of applying a voltage across said conductive layer and said substrate to burn away said fuse region.

5. A method for preventing damage to an array element in an integrated circuit structure due to charge build up across a dielectric layer during manufacture or handling of the structure, the method comprising the step of providing a continual short circuit across the dielectric layer during preselected processing steps.

6. The method of claim 5 further comprising the step of removing the short circuit after completion of the preselected processing steps.

7. The method of claim 5 wherein the dielectric layer is positioned between a gate structure and a substrate and the short circuit is formed from the gate structure to the substrate.

8. The method of claim 5 wherein the integrated circuit structure is of the type used for focal plane imaging.

9. The method of claim 7 wherein the step of forming the short circuit is accomplished by forming a fuse between the gate structure and the substrate.

10. The method of claim 8 wherein the element comprises a mercury cadmium telluride substrate, a dielectric layer formed over the substrate and a nickel gate structure formed over the dielectric layer, the method further comprising the step of removing the short circuit after completion of the preselected processing steps.

11. The method of claim 9 further comprising the step of removing the short circuit by applying sufficient voltage between the gate structure and the substrate to blow out the fuse, said voltage being insufficient to cause a breakdown of the dielectric layer.

12. The method of claim 10 wherein the step of forming the short circuit is accomplished by forming a fuse between the gate structure and the substrate.

13. The method of claim 10 further comprising the steps of:
   forming a via between the substrate and the gate structure; and
   forming a fuse along the via to electrically connect the substrate with the gate structure.

14. The method of claim 11 wherein insufficient voltage is applied to alter the flat band voltage of the element.

15. The method of claim 12 wherein the step of removing the short circuit is accomplished by applying sufficient voltage between the gate structure and the substrate to blow out the fuse, said voltage being insufficient to cause a breakdown of the dielectric layer.

16. The method of claim 13 wherein the step of removing the short circuit is accomplished by applying sufficient voltage between the gate structure and the substrate to blow out the fuse, said voltage being insufficient to cause a breakdown of the dielectric layer.

17. The method of claim 15 wherein said voltage is insufficient to alter the flat band voltage of the element.

18. The method of claim 16 wherein the dielectric layer is a multilayered structure and the step of forming the via is accomplished by etching through said multilayered structure.

* * * * *